United States Patent
Zhang et al.

(10) Patent No.: US 11,385,537 B2
(45) Date of Patent: Jul. 12, 2022

(54) PHASE SHIFT MASK AND ELECTRONIC COMPONENT MANUFACTURING METHOD

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiaoxiang Zhang, Beijing (CN); Mingxuan Liu, Beijing (CN); Huibin Guo, Beijing (CN); Yongzhi Song, Beijing (CN); Xiaolong Li, Beijing (CN); Wenqing Xu, Beijing (CN); Zumou Wu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 508 days.

(21) Appl. No.: 16/343,756

(22) PCT Filed: Oct. 26, 2018

(86) PCT No.: PCT/CN2018/112152
§ 371 (c)(1),
(2) Date: Apr. 20, 2019

(87) PCT Pub. No.: WO2019/153796
PCT Pub. Date: Aug. 15, 2019

(65) Prior Publication Data
US 2021/0356856 A1  Nov. 18, 2021

(30) Foreign Application Priority Data
Feb. 11, 2018 (CN) .......................... 201810142878.7

(51) Int. Cl.
*G03F 1/32* (2012.01)
*G03F 1/30* (2012.01)
(Continued)

(52) U.S. Cl.
CPC .................. *G03F 1/32* (2013.01); *G03F 1/26* (2013.01); *G03F 1/30* (2013.01); *G03F 1/36* (2013.01); *H01L 21/0274* (2013.01)

(58) Field of Classification Search
CPC ..... G03F 1/32; G03F 1/26; G03F 1/30; G03F 1/36
See application file for complete search history.

(56) References Cited

U.S. PATENT DOCUMENTS 5,582,938 A   12/1996   Ham
8,323,857 B2  12/2012   Hsieh et al.
(Continued)

FOREIGN PATENT DOCUMENTS

CN   102759851 A   10/2012

OTHER PUBLICATIONS

Extended European Search Report in Application No. 18852746, dated Oct. 25, 2021.
International Search Report in International Application No. PCT/CN2018/112152, dated Dec. 28, 2018.
First Office Action in CN Application No. 201810142878.7, dated Feb. 3, 2020.

*Primary Examiner* — Stewart A Fraser
(74) *Attorney, Agent, or Firm* — Syncoda LLC; Feng Ma

(57) ABSTRACT

A phase shift mask includes a transparent substrate and light-shielding portions. The light-shielding portions include a first light-shielding portion, and over one side of it, a first compensating light-shielding portion, which has a first distance to the first light-shielding portion and a first width smaller than a resolution of an exposing machine utilized for an exposure process using the phase shift mask. The light-shielding portions can further include a second compensating light-shielding portion, having a second distance to (Continued)

another side of the first light-shielding portion and a second width smaller than the resolution of the exposing machine. The first distance and the second distance respectively allow the first and the second compensating light-shielding portion to reduce an exposure at a region corresponding to two sides of the first light-shielding portion during the exposure process. A method manufacturing an electronic component utilizing the phase shift mask is also provided.

18 Claims, 7 Drawing Sheets

(51) Int. Cl.
    *G03F 1/36*     (2012.01)
    *G03F 1/26*     (2012.01)
    *H01L 21/027*     (2006.01)

(56) References Cited

U.S. PATENT DOCUMENTS

| | | | |
|---|---|---|---|
| 8,431,291 B2 * | 4/2013 | Liu | G03F 1/00 |
| | | | 430/5 |
| 9,927,694 B2 * | 3/2018 | Ugajin | G06F 30/39 |
| 2004/0219435 A1 | 11/2004 | Wu et al. | |
| 2007/0224519 A1 | 9/2007 | Sivakumar et al. | |
| 2008/0176150 A1 | 7/2008 | Saito | |
| 2008/0261124 A1 | 10/2008 | Saito | |
| 2011/0229804 A1 * | 9/2011 | Yang | G03F 1/36 |
| | | | 430/5 |
| 2018/0239237 A1 * | 8/2018 | Lai | G03F 1/26 |

\* cited by examiner

PHASE SHIFT MASK AND ELECTRONIC COMPONENT MANUFACTURING METHOD

CROSS-REFERENCE TO RELATED APPLICATION

The present application is a continuation of, and claims priority to Chinese Patent Application No. 201810142878.7 filed on Feb. 11, 2018, the disclosure of which is hereby incorporated by reference in its entirety.

TECHNICAL FIELD

The present disclosure relates generally to the field of semiconductor technologies, and more specifically to a phase shift mask, and a method for manufacturing an electronic component utilizing the phase shift mask.

BACKGROUND

Masks (also known as photomasks) are important tools in both a design end and a manufacturing end in the field of semiconductor technologies. Recently with the technology progress, a type of such masks, termed phase shift masks (PSM), are emerging and receive a lot of attention.

A phase shift mask typically includes a substrate and a light-shielding portion and a light-transmitting portion over the substrate. The light-shielding portion usually has a composition of metal chromium and a phase shift material that surrounds the metal chromium. During an exposure by means of the phase shift mask, lights passing through the phase shift material produce a phase change of 180 degrees. Because the interference of the lights is destroyed thereby, the resolution of patterns formed thereby can be improved.

SUMMARY

In a first aspect, the present disclosure provides a phase shift mask.

The phase shift mask comprises a transparent substrate and a plurality of light-shielding portions over the transparent substrate. The plurality of light-shielding portions comprise a first light-shielding portion and a first compensating light-shielding portion, which are arranged over one side of the first light-shielding portion. It is configured such that there is a first distance between the first compensating light-shielding portion and the first light-shielding portion; the first compensating light-shielding portion has a first width smaller than a resolution of an exposing machine utilized for an exposure process using the phase shift mask; and the first distance is configured to allow the first compensating light-shielding portion to reduce an exposure at a region corresponding to the one side of the first light-shielding portion during the exposure process.

According to some embodiments of the phase shift mask, the plurality of light-shielding portions further comprise a second compensating light-shielding portion, which has a second distance to another side of the first light-shielding portion facing thereto. It is configured such that the second compensating light-shielding portion has a second width smaller than the resolution of the exposing machine; and the second distance is configured to allow the second compensating light-shielding portion to reduce an exposure at a region corresponding to the another side of the first light-shielding portion during the exposure process.

Herein, optionally, the first light-shielding portion can be a wiring-shielding portion. As such, the first compensating light-shielding portion and the second compensating light-shielding portion can be respectively arranged over two sides of the wiring-shielding portion along an extension direction of the wiring-shielding portion.

Further optionally, at least one of the first compensating light-shielding portion and the second compensating light-shielding portion can be substantially parallel to the wiring-shielding portion.

Preferably, each of the first compensating light-shielding portion and the second compensating light-shielding portion can be substantially parallel to the wiring-shielding portion.

According to some embodiments of the phase shift mask, the first width of the first compensating light-shielding portion is substantially equal to the second width of the second compensating light-shielding portion, and the first distance is substantially equal to the second distance.

In any of embodiments of the phase shift mask, the resolution of the exposing machine can be about 3.0 µm, and the first width can have a range of about 1 µm-2 µm.

According to some embodiments of the phase shift mask, the plurality of light-shielding portions further comprise a second light-shielding portion and a third light-shielding portion, which are spaced apart from each other with a third distance. It is configured such that a difference between the first distance and the third distance is smaller than or equal to 0.3 µm.

Herein, optionally, the first distance can be substantially equal to the third distance.

Optionally, the second light-shielding portion and the third light-shielding portion can have a substantially same shape and size.

Further optionally, the second light-shielding portion, the third light-shielding portion, and the channel light-transmitting region are configured respectively for defining a source electrode, a drain electrode, and a channel region of a thin-film transistor.

According to some embodiments of the phase shift mask, each of the plurality of light-shielding portions comprises a light-shielding member and at least one phase shift member. It is configured such that an orthographic projection of the light-shielding member on the transparent substrate defines a first region; and an orthographic projection of the at least one phase shift member on the transparent substrate defines a second region. It is further configured such that each outer rim of the first region is surrounded by a phase shift region of a third width, and the phase shift region is within the second region but not within the first region.

Herein, optionally, the third width can be smaller than 1.0 µm, and more preferably can be about 0.6 µm.

In a second aspect, the present disclosure further comprises a method for manufacturing an electronic component. The method comprises the following steps:

forming a first layer;

forming a photoresist layer over the first layer; and performing an exposure process by means of a phase shift mask aligned over the photoresist layer to thereby obtain a pattern in the photoresist layer, wherein the phase shift mask comprises a transparent substrate and a plurality of light-shielding portions over the transparent substrate.

Herein the plurality of light-shielding portions comprise a first light-shielding portion and a first compensating light-shielding portion; the first compensating light-shielding portion has a first distance to one side of the first light-shielding portion facing thereto over the transparent substrate; the first compensating light-shielding portion has a first width smaller than a resolution of an exposing machine utilized for an exposure process using the phase shift mask; and the first distance is within a first pre-set range configured to allow the first compensating light-shielding portion to reduce an exposure at a region corresponding to the one side of the first light-shielding portion during the exposure process.

Optionally, in the method, the plurality of light-shielding portions further comprise a second light-shielding portion and a third light-shielding portion, which together define a channel light-transmitting region having a third width sandwiched therebetween. It is configured such that a difference between the first distance and the third distance is smaller than or equal to 0.3 μm.

Further optionally, the first light-shielding portion is a wiring-shielding portion; and the plurality of light-shielding portions further comprise a second compensating light-shielding portion having a second distance to another side of the wiring-shielding portion facing thereto over the transparent substrate.

It is further configured such that the second compensating light-shielding portion has a second width smaller than the resolution of the exposing machine; the second distance is within a second pre-set range configured to allow the second compensating light-shielding portion to reduce an exposure at a region corresponding to the another side of the wiring-shielding portion during the exposure process; and the first compensating light-shielding portion and the second compensating light-shielding portion are respectively arranged over two sides of the wiring-shielding portion along an extension direction thereof.

Optionally, the first layer can be a metal layer. As such, the method further comprises the following step:

performing a patterning process on the metal layer using the pattern in the photoresist layer to thereby form a metallic pattern.

Herein, optionally, the electronic component can be an array substrate, and the metallic pattern comprises a source electrode, a drain electrode, and a metallic wiring.

BRIEF DESCRIPTION OF THE DRAWINGS

To more clearly illustrate some of the embodiments, the following is a brief description of the drawings.

The drawings in the following descriptions are only illustrative of some embodiments. For those of ordinary skill in the art, other drawings of other embodiments can become apparent based on these drawings.

DETAILED DESCRIPTION

At present, in the manufacturing process of high-resolution display panels, phase shifting masks are usually used to make an array substrate in the display panels. For example, as illustrated in FIG. 1, when using a phase shift mask according to an existing technology to form source electrodes, drain electrodes, and data lines in an array substrate, a photoresist layer 2 is first formed on a metal layer 1, and then a phase shift mask is employed in an exposure process over the photoresist layer 2.

Figure 1:
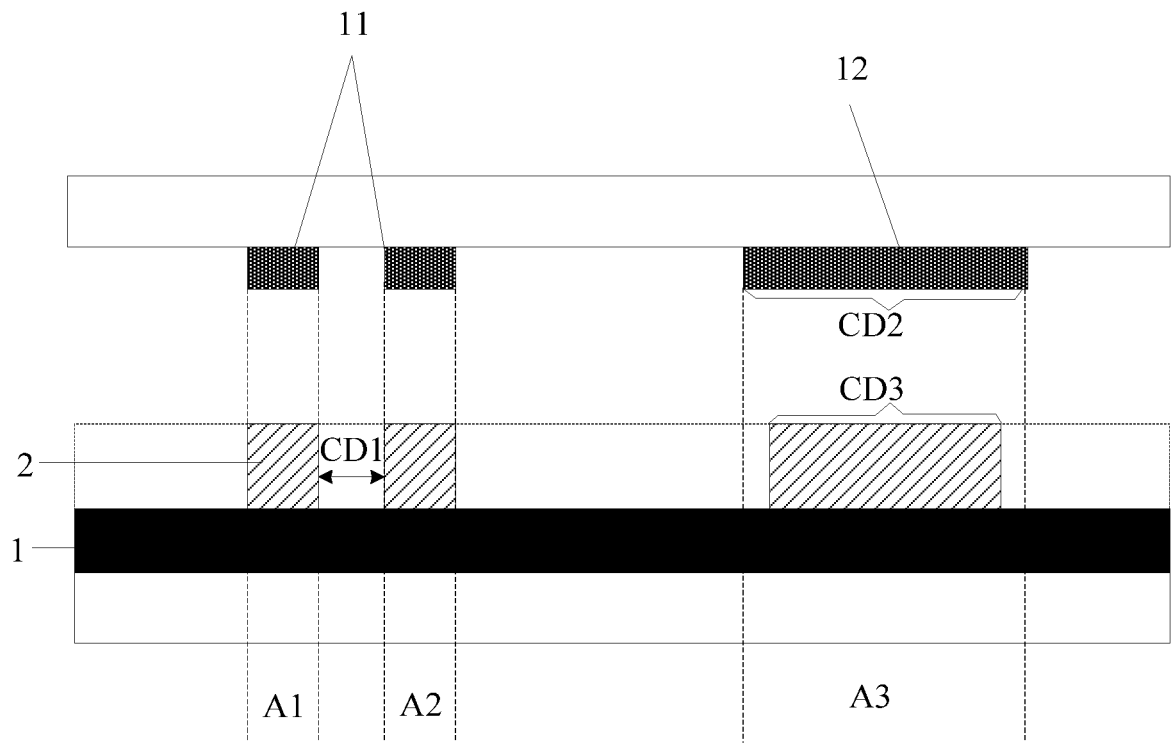
FIG. 1 is a schematic diagram of the structure of a phase shift mask according to an existing technology.

As specifically shown in FIG. 1, a first light-shielding portion 12 of the phase shift mask positionally corresponds to a wiring (e.g. a data line) area A3 in the metal layer 1, and two second light-shielding portions 11 of the phase shift mask positionally correspond to a source electrode region A1 and a drain electrode region A2 in the metal layer 1, respectively.

During the exposure process, a relatively narrow channel with a width of CD1 needs to be formed between the source electrode region A1 and the drain electrode region A2, as such a relatively large exposure energy is required to ensure that the width CD1 of the channel can reach a target requirement after exposure.

However, due to the light interference effect, a relatively large exposure energy can cause an overexposure on the first light-shielding portion 12, which in turn causes that a size CD3 of the photoresist layer 2 at the wiring area A3 is smaller than a size CD2 of the first light-shielding portion 12 of the phase shift mask. As a consequence, the wirings (e.g. data lines) thereby formed are thinner than designed.

In order to address the above mentioned issue associated with existing phase shift masks, the present disclosure provides a phase shift mask, an array substrate and a manufacturing method thereof, and a display apparatus.

In the following, with reference to the drawings of the embodiments disclosed herein, the technical solutions of various embodiments of the present disclosure will be described in a clear and fully understandable way.

It is noted that the described embodiments are merely some but not all of the embodiments of the invention. Based on the described embodiments of the invention, those ordinarily skilled in the art can obtain other embodiment(s), which come(s) within the scope sought for protection by the invention.

It is further noted that the shapes and dimensions of various components, members, and parts as illustrated in each of the drawings do not represent their actual situations and thus serve for illustrating purposes only.

In a first aspect, a phase shift mask is disclosed.

The phase shift mask includes a transparent substrate and a plurality of light-shielding portions. The plurality of light-shielding portions include a first light-shielding portion, and over one side of it, a first compensating light-shielding portion, which has a first distance to the first light-shielding portion and a first width smaller than a resolution of an exposing machine utilized for an exposure process using the phase shift mask. The plurality of light-shielding portions can further comprise a second compensating light-shielding portion, having a second distance to another side of the first light-shielding portion and a second width smaller than the resolution of the exposing machine. The first distance and the second distance respectively allow the first and the second compensating light-shielding portion to reduce an exposure at a region corresponding to the two sides of the first light-shielding portion during the exposure process.

In the following, a phase shift mask for manufacturing an array substrate is described in detail as an illustrating example. It is noted, however, that the present disclosure is not limited to the array substrate and the display technologies, and the phase shift mask can be employed for a patterning process for manufacturing a variety of electronic components such as a CMOS, a CPU, or another type of integrated circuits whose manufacturing requires at least one patterning process.

Figure 2:
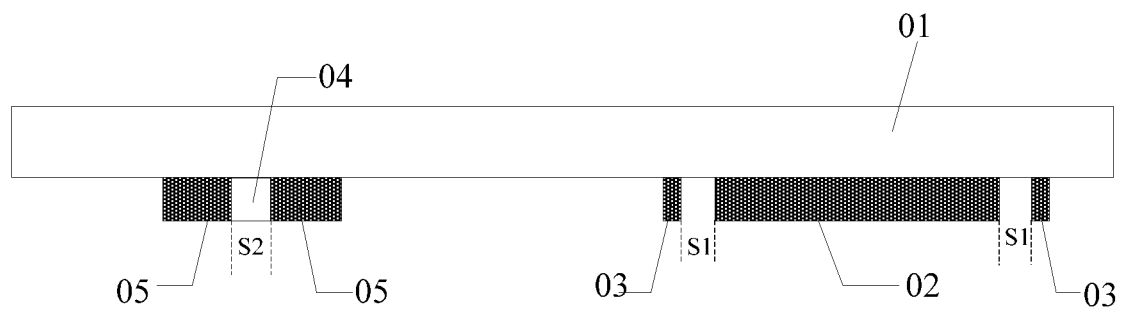
FIG. 2 is a cross-sectional view of a phase shift mask according to some embodiments of the disclosure.

FIG. 2 is a cross-sectional view of a phase shift mask according to some embodiments of the disclosure. As shown in FIG. 2, the phase shift mask comprises a substrate 01. Over the substrate 01, the phase shift mask further comprises a first light-shielding portion 02 and a compensating light-shielding portion 03 arranged over each side of the first light-shielding portion 02.

Each compensating light-shielding portion 03 is configured to have a width smaller than a resolution of an exposing machine utilized to perform an exposure using the phase shift mask described above. A gap S1 having a width within a pre-set range is arranged between each compensating light-shielding portion 03 and the first light-shielding portion 02.

Specifically in the cross-section view of the phase shift mask shown in FIG. 2, two compensating light-shielding portions 03 are shown to juxtapose the first light-shielding portion 02, and each compensating light-shielding portion 03 has a gap S1 to the side of the first light-shielding portion 02 that it is directly opposing to the each compensating light-shielding portion 03.

In the phase shift mask described above and illustrated in FIG. 2, because of the presence of a compensating light-shielding portion 03 over each side of the first light-shielding portion 02, the exposure at a region corresponding to the each side of the first light-shielding portion 02 can be compensated (more specifically, reduced) by the compensating light-shielding portion 03. As such the issue of overexposure at a region corresponding to the first light-shielding portion 02 can be effectively prevented or avoided.

Additionally, because each compensating light-shielding portion 03 is further configured to have a width smaller than the resolution of the exposing machine, the photoresist used during exposure will not generate any remains at a region corresponding to the each compensating light-shielding portion 03. In other words, a pattern will not be generated after exposure at a region corresponding to the each compensating light-shielding portion 03.

According to some embodiments, the resolution of the exposing machine is about 3.0 μm, and the width of each compensating light-shielding portion 03 of the phase shift mask can be about 1 μm-2 μm.

Figure 3:
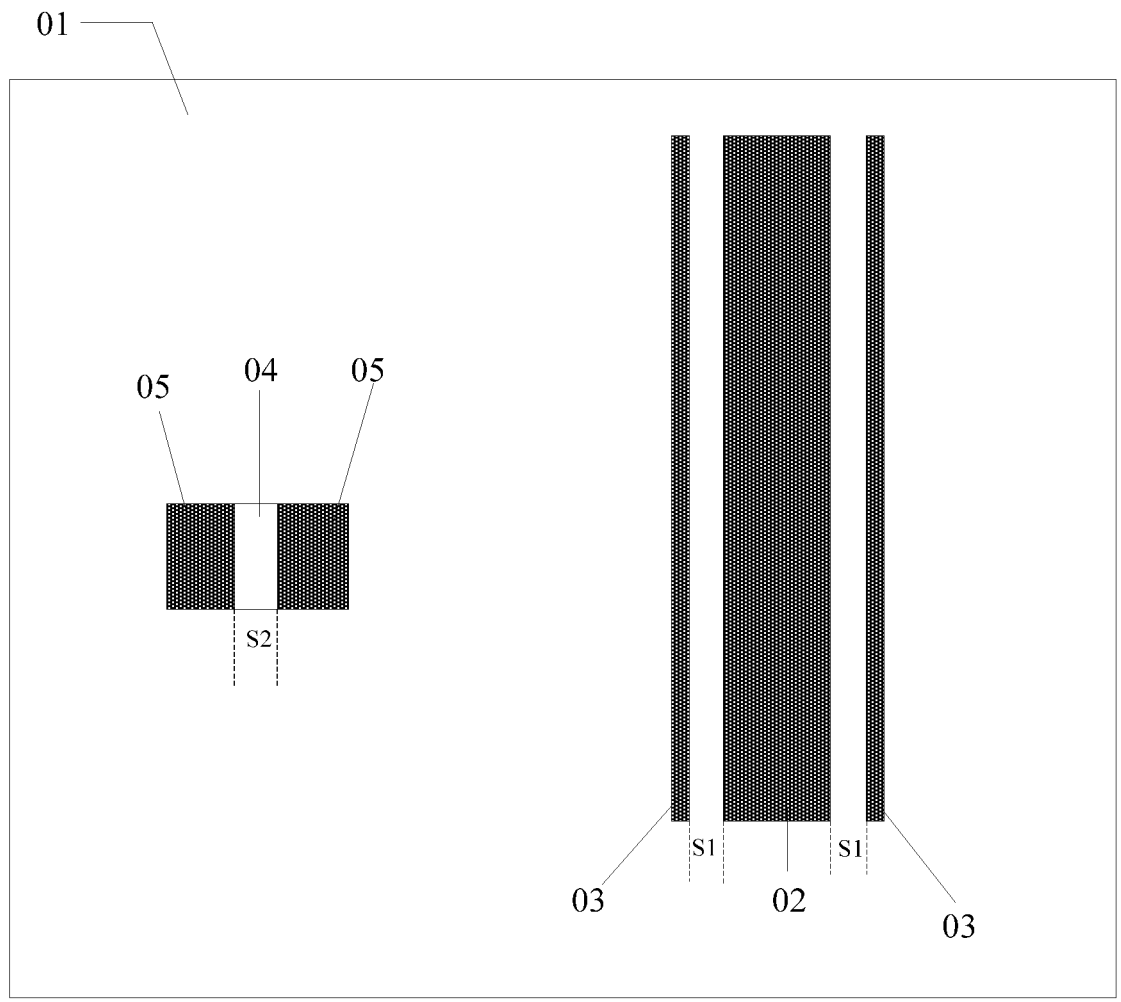
FIG. 3 is a top view of a phase shift mask according to some embodiments of the disclosure.

Optionally, the first light-shielding portion 02 of the phase shift mask is designed as a wiring-shielding portion for the forming of a wiring such as a data line, as shown in FIG. 3, and a compensating light-shielding portion 03 is arranged to be over each of two sides of the first light-shielding portion 02 along an extension direction thereof.

Optionally, the compensating light-shielding portion 03 is configured to have a substantially equal distance to the each side of the first light-shielding portion 02 corresponding to the compensating light-shielding portion 03 (i.e. substantially equal width of the gap S1 between the compensating light-shielding portion 03 and the first light-shielding portion 02 at any crossline perpendicular to the extension direction of the first light-shielding portion 02).

In the specific embodiment of the phase shift mask as shown in FIG. 3, the compensating light-shielding portion 03 is shown to be substantially parallel to the first light-shielding portion 02 to thereby have a substantially equal distance to the each side of the first light-shielding portion 02 corresponding thereto.

According to some embodiments of the disclosure illustrated in FIG. 2 or FIG. 3, the phase shift mask further comprises a channel light-transmitting portion 04, and a second light-shielding portion arranged over each of the two sides of the channel light-transmitting portion 04. In other words, the phase shift mask further comprises two second light-shielding portions 05 and a channel light-transmitting portion 04 between the two second light-shielding portions 04.

Herein, the two second light-shielding portions 05 can be electrode-shielding portions, which are specifically used for forming a source electrode and a drain electrode, respectively, the channel light-transmitting portion 04 can be used for the formation of a channel in a semiconductor layer that is between the source electrode and the drain electrode, and the first light-shielding portion 02 can used for forming a wiring, such as a data line.

It is noted that above embodiments shown in FIG. 2 and FIG. 3 are for the illustration of the corresponding positional relationship among the compensating light-shielding portions 03, the first light-shielding portion 02, and the second light-shielding portions 05 in the phase shift mask disclosed herein. There is no limitation to the shape of these portions in the phase shift mask. For example, the first light-shielding portion 02 can be a straight line, a curved line, a bent line, etc.

Herein, a width S2 of the channel light-transmitting portion 04 is substantially a width of a gap between the two second light-shielding portions 5.

In the phase shift mask, the effective compensation by a compensating light-shielding portion 03 can be ensured only if the width S1 of the gap between the compensating light-shielding portion 03 and the first light-shielding portion 02 is within a pre-set range. Too large a gap width S1 can result in no compensation effect, whereas too small a gap width S1 can cause insufficient exposure of a region corresponding to the first light-shielding portion 02.

According to some embodiments, the width S1 of the gap between the compensating light-shielding portion 03 and the first light-shielding portion 02 shall be configured to allow a region corresponding to the compensating light-shielding portion 03 and the first light-shielding portion 02 has a comparable exposure (i.e. exposure to a similar degree) than a region corresponding to the channel light-transmitting portion 04.

According to some embodiments, the width S1 of the gap is configured to be as close as possible to the width S2 of the channel light-transmitting portion 04, to thereby ensure that a region corresponding to the compensating light-shielding portion 03 and the first light-shielding portion 02 has a comparable exposure than a region corresponding to the channel light-transmitting portion 04. Optionally, the width S1 of the gap between the compensating light-shielding portion 03 and the first light-shielding portion 02 is configured to have a difference of smaller than or equal to 0.3 μm compared with the width S2 of the channel light-transmitting portion 04. In other words, the following formulas need to be satisfied: S1−S2<0.3 μm or S2−S1<0.3 μm.

According to some preferred embodiments of the phase shift mask, the width S1 of the gap between the compensating light-shielding portion 03 and the first light-shielding portion 02 is substantially equal to the width S2 of the channel light-transmitting portion 04.

Optionally, the compensating light-shielding portion 03 and the first light-shielding portion 02 can have a substantially same composition.

Figure 4:
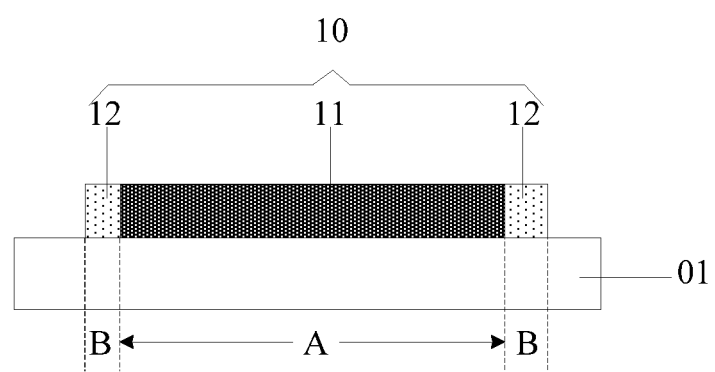
FIG. 4 is a cross-sectional view of one single light-shielding portion in a phase shift mask according to some embodiment of the disclosure.
Figure 5:
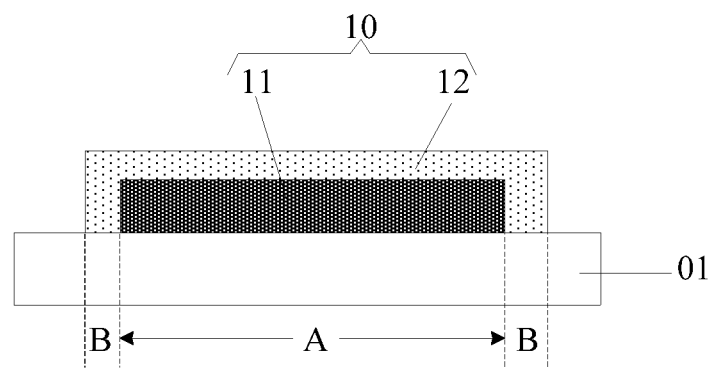
FIG. 5 is a cross-sectional view of one single light-shielding portion in a phase shift mask according to some other embodiment of the disclosure.
Figure 6:
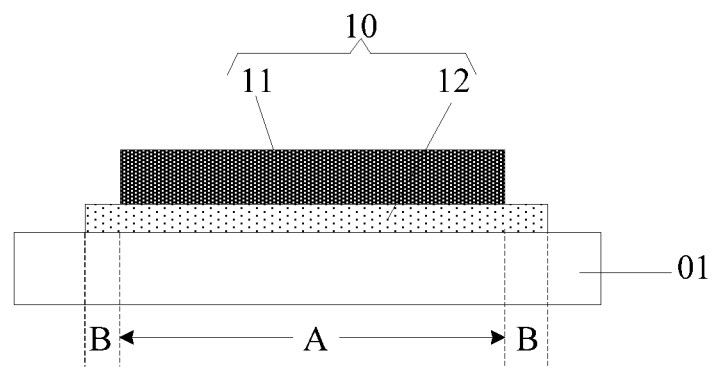
FIG. 6 is a cross-sectional view of one single light-shielding portion in a phase shift mask according to yet some other embodiment of the disclosure.

FIGS. 4-6 respectively illustrate a cross-sectional view of one single light-shielding portion in a phase shift mask according to three different embodiments of the disclosure. As shown in these three figures, each light-shielding portion in a phase shift mask includes a non-light-transmitting region A and a phase shift region B surrounding each side of the non-light-transmitting region A.

A light-shielding material 11, such as metal chromium, is arranged at the non-light-transmitting region A over the substrate 01, whereas a phase shift material 12 is arranged at the phase shift region B over the substrate 01. The phase shift material 12 can cause the lights passing therethrough to produce a phase change of 180 degrees. Specifically, the phase shift region B has a width ranging 0-1.0 μm, such as 0.6 μm.

During manufacturing process of the phase shift mask disclosed herein, a pattern for the light-shielding material can be first formed over a substrate, followed by the formation of a pattern for the phase shift material over a substrate. Alternatively, a pattern for the phase shift material can be first formed over a substrate, followed by the formation of a pattern for the light-shielding material over a substrate. There are no limitations herein regarding the specific steps for manufacturing the phase shift mask disclosed herein.

In the embodiment of the phase shift mask specifically shown in FIG. 4, the phase shift material 12 is present only in the phase shift region B, but is not present in the non-light-transmitting region A. The light-shielding material 11 is present only in the non-light-transmitting region A but not in the phase shift region B. In other words, the light-shielding material 11 and the phase shift material 12 are arranged at a substantially same layer on the substrate 01, and are respectively within a pre-determined non-light-transmitting region A and within a pre-determined phase shift region B.

In the embodiments of the phase shift mask shown in FIG. 5 and FIG. 6, the phase shift material 12 is present in both the phase shift region B and the non-light-transmitting region A. Specifically, in the embodiment of the phase shift mask shown in FIG. 5, a whole layer of the light-shielding material 11 is completely surrounded and covered by a layer of the phase shift material 12 on the substrate 01, and the layer of the phase shift material 12 thereby covers both the phase shift region B and the non-light-transmitting region A.

In the embodiment of the phase shift mask shown in FIG. 6, a layer of the phase shift material 12 on the substrate 01 is disposed on the substrate 01 and covers both the phase shift region B and the non-light-transmitting region A, whereas a layer of the light-shielding material 11 is further stacked over a surface of the layer of the phase shift material 12 distal to the substrate 01 to cover only the non-light-transmitting region A, but not the phase shift region B.

It is noted that these above embodiments serve only illustrating examples only, and other arrangements for disposing the light-shielding material 11 and the phase shift material 12 over the substrate 01 are also possible. It is also noted that each of FIGS. 4-6 illustrates only one single light-shielding portion of a phase shift mask, and in the phase shift mask disclosed herein, each light-shielding portion (i.e. the first light-shielding portions 02, the compensating light-shielding portions 03, and the second light-shielding portions 05) comprises both a light-shielding material and a phase shift material, and the light-shielding material is present only in a pre-determined non-light-transmitting region, and the phase shift material is present only in a pre-determined phase shift region.

Figure 7:
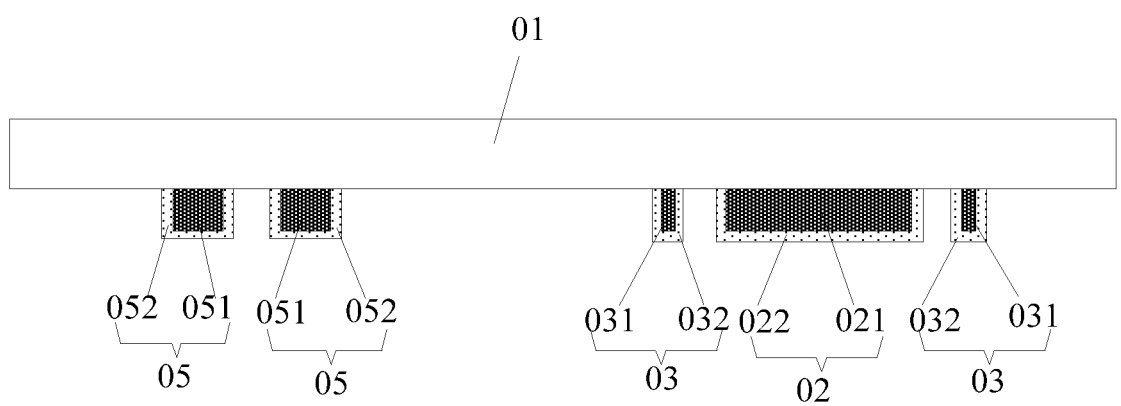
FIG. 7 is a cross-sectional view of a phase shift mask according to some specific embodiment of the disclosure.

In the embodiment of the phase shift mask specifically illustrated in FIG. 7, the first light-shielding portion 02 comprises a light-shielding material 021 and a phase shift material 022, the compensating light-shielding portions 03 comprises a light-shielding material 031 and a phase shift material 032, and the second light-shielding portions 05 comprises a light-shielding material 051 and a phase shift material 052.

The specific embodiments shown in FIG. 7 have a substantially same arrangement type as that illustrated in FIG. 5, wherein for each light-shielding portion, a layer of the light-shielding material is completely covered and surrounded by a layer of the phase shift material. It is noted that it is possible that the arrangement for the light-shielding material 11 and the phase shift material 12 over the substrate 01 can have a type illustrated in FIG. 4 or FIG. 6, and it is also possible that the arrangement for the plurality of light-shielding portions in the phase shift mask have a mixed type. There are no limitations herein.

Herein, in phase shifting mask, the substrate can be made of a transparent material. In the phase shift mask, except for regions corresponding to the light-shielding portions, other regions are all light-transmissive. The channel light-transmitting portion 04 illustrated in FIG. 2 and FIG. 4 can be between two neighboring light-shielding portions, which can be filled with a light-transmissive material, or alternatively no other material is filled in the light-transmitting portion.

It is noted the channel light-transmitting portion disclosed herein is referred to as a light-transmitting portion having a width smaller than a threshold value such that exposure process by means of the phase shifting mask to thereby form a pattern having a width of the threshold value that corresponds to the light-transmitting portion requires a relatively greater exposure energy than other patterns corresponding to other light-transmitting portions.

In a second aspect, the present disclosure further provides a method for manufacturing an array substrate utilizing the phase shift mask according to any one of the embodiments as described above.

Specifically, the method comprises the following steps:

S100: forming a metal layer;

S200: performing a patterning over the metal layer using a phase shift mask comprising a first light-shielding portion to thereby form a first metallic pattern at a region of the metal layer corresponding to the first light-shielding portion.

Herein because of the presence of a compensating light-shielding portions over each side of a first light-shielding portion, the exposure at a region corresponding to the each side of the first light-shielding portion can be compensated by the compensating light-shielding portion. As such the issue of overexposure at a region corresponding to the first light-shielding portion can be effectively prevented.

In addition, because each compensating light-shielding portion is further configured to have a width smaller than a resolution of an exposing machine employed for the patterning process, the photoresist used during exposure will not generate any remains at a region corresponding to the each compensating light-shielding portion, and therefore, a pattern will not be generated after exposure at a region corresponding to the each compensating light-shielding portion.

Optionally, the first light-shielding portion is a wiring light-shielding portion, and accordingly the first metallic pattern formed after step S102 comprises a pattern of a metallic wiring, such as a data line.

Optionally, prior to step S100 of forming a metal layer, the array substrate manufacturing method further comprises:

S10: forming a gate electrode;

S20: forming a gate insulating layer over the gate electrode; and

S30: forming a semiconductor layer over the gate insulating layer.

Accordingly, in step S200 of the array substrate manufacturing method, the phase shift mask to be employed for the patterning process further comprises a channel light-transmitting portion, and a second light-shielding portion arranged over each of the two sides of the channel light-transmitting portion. As such, after the patterning process in step S200, a second metallic pattern is formed, comprising a channel formed at a region of the metal layer corresponding to the channel light-transmitting portion, and a source electrode and a drain electrode formed at a region of the metal layer corresponding to the second light-shielding portions.

Figure 8:
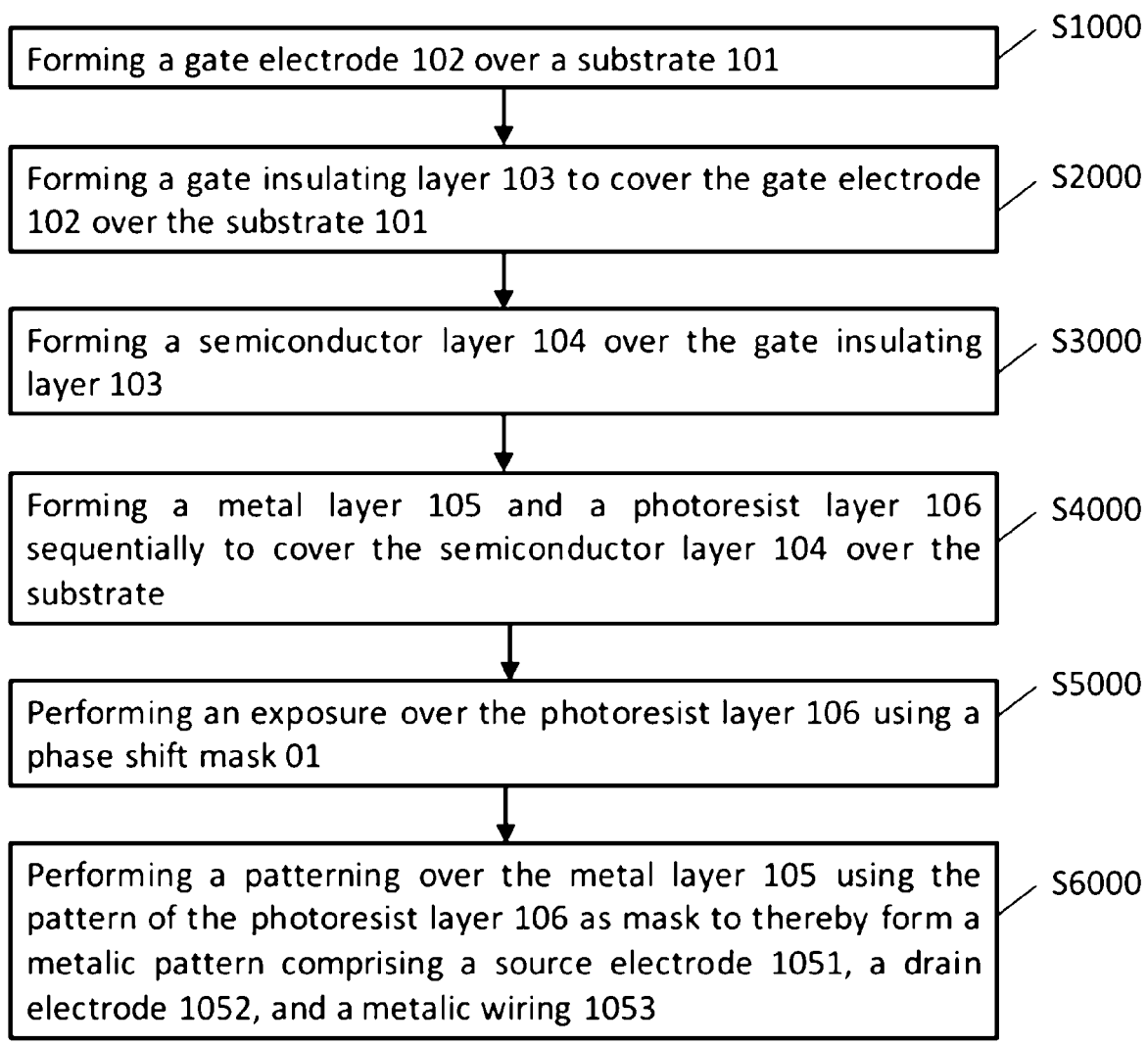
FIG. 8 is a flow chart of a method for manufacturing an array substrate according to certain embodiment of the disclosure.
Figure 9A:
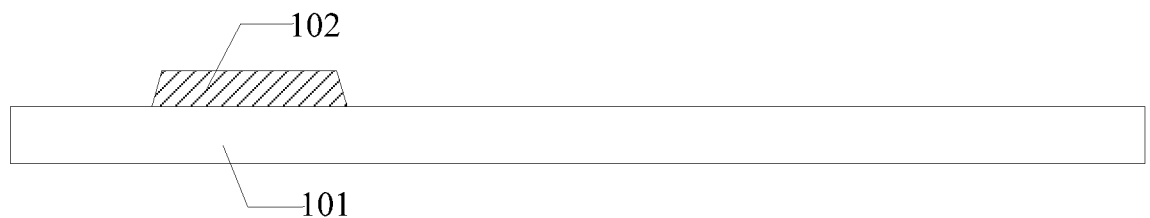
FIG. 9A is a cross-sectional view of an intermediate product obtained after step S1000 of the array substrate manufacturing method illustrated in FIG. 8.
Figure 9B:
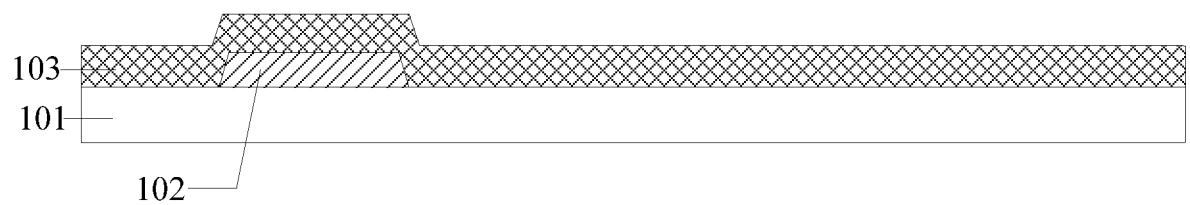
FIG. 9B is a cross-sectional view of an intermediate product obtained after step S2000 of the array substrate manufacturing method illustrated in FIG. 8.
Figure 9C:
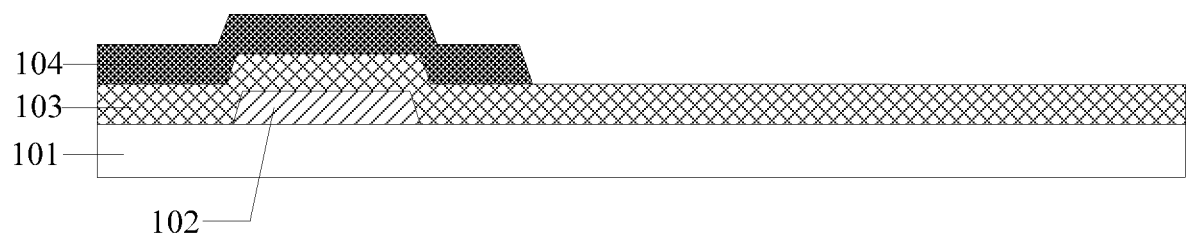
FIG. 9C is a cross-sectional view of an intermediate product obtained after step S3000 of the array substrate manufacturing method illustrated in FIG. 8.
Figure 9D:
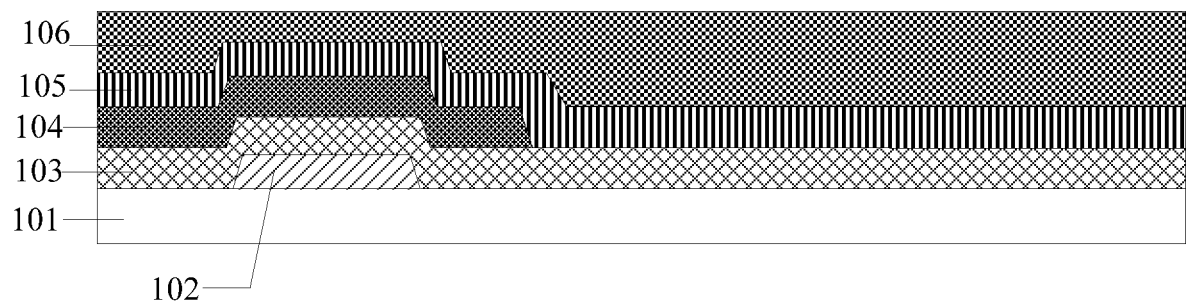
FIG. 9D is a cross-sectional view of an intermediate product obtained after step S4000 of the array substrate manufacturing method illustrated in FIG. 8.
Figure 9E:
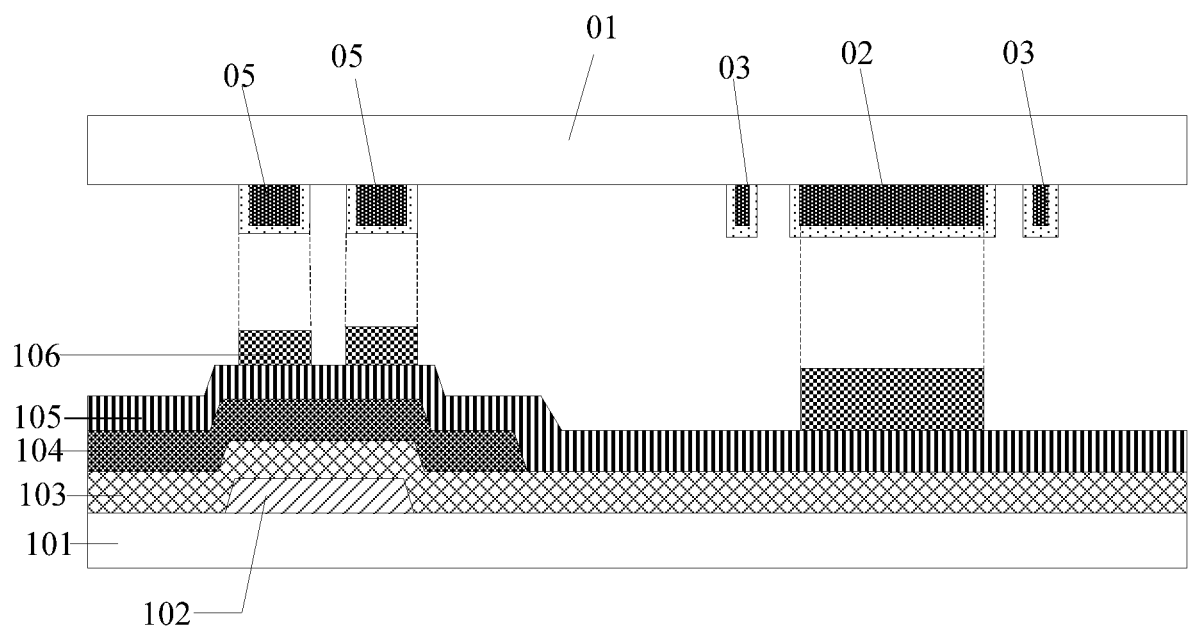
FIG. 9E is a cross-sectional view of an intermediate product obtained after step S5000 of the array substrate manufacturing method illustrated in FIG. 8.
Figure 9F:
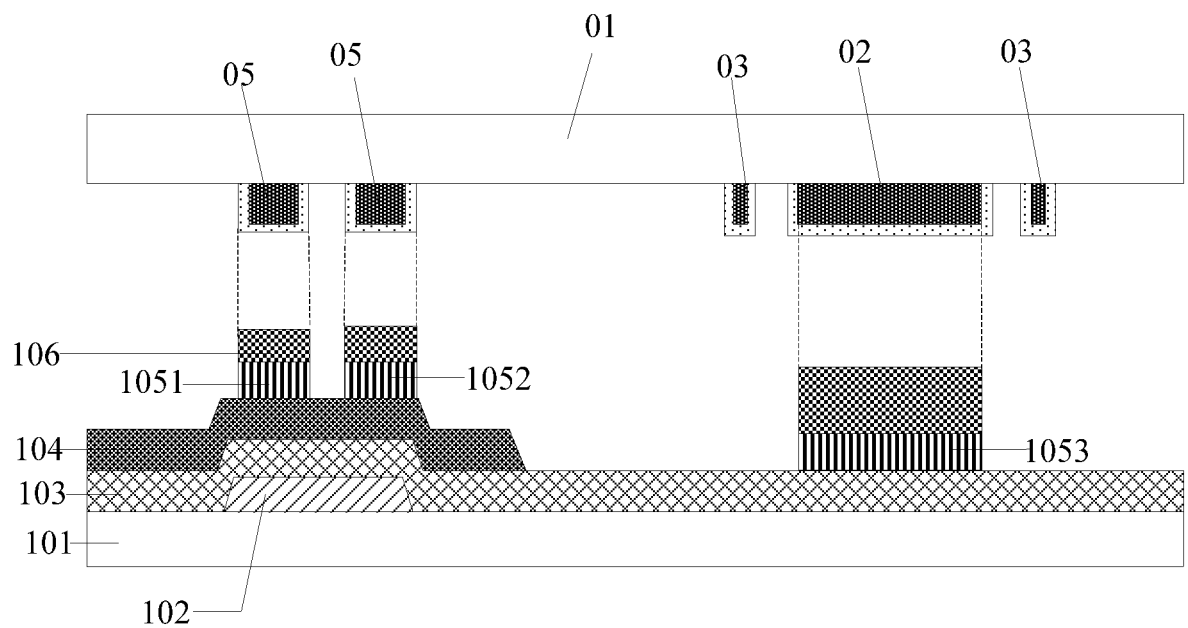
FIG. 9F is a cross-sectional view of an intermediate product obtained after step S6000 of the array substrate manufacturing method illustrated in FIG. 8.

In the following, one specific embodiment is described in detail for further illustration of the array substrate manufacturing method. As shown in FIG. 8, the method specifically includes:

S1000: forming a gate electrode 102 over a substrate 101, as illustrated in FIG. 9A;

S2000: forming a gate insulating layer 103 to cover the gate electrode 102 over the substrate 101, as illustrated in FIG. 9B;

S3000: forming a semiconductor layer 104 over the gate insulating layer 103, as illustrated in FIG. 9C;

S4000: forming a metal layer 105 and a photoresist layer 106 sequentially to cover the semiconductor layer 104 over the substrate, as illustrated in FIG. 9D:

S5000: performing an exposure over the photoresist layer 106 using a phase shift mask 01 illustrated in FIG. 7 to thereby form a pattern illustrated in FIG. 9E;

S6000: performing a patterning over the metal layer 105 using the pattern of the photoresist layer 106 as mask to thereby form a metallic pattern comprising a source electrode 1051, a drain electrode 1052, and a metallic wiring 1053, as illustrated in FIG. 9F.

Herein in the metallic pattern formed in step S6000, the source electrode 1051 and the drain electrode 1052 are formed at regions corresponding to the second light-shielding portions 05 of the phase shift mask 01, and the metallic wiring 1053 is formed at a region corresponding to the first light-shielding portion 02 of the phase shift mask 01.

In the above mentioned array substrate manufacturing method, because of the presence of a compensating light-shielding portions over each side of a first light-shielding portion in the phase shift mask, the exposure at a region corresponding to the each side of the first light-shielding portion can be reduced by the compensating light-shielding portion to thereby effectively prevent the overexposure issue of at a region corresponding to the first light-shielding portion. As such, by means of the phase shift mask disclosed herein, while a gap width between the source electrode and the drain electrode can meet a practical requirement, a width of the metallic wiring formed thereby is not unfavorably reduced.

In a third aspect, the present disclosure further provides an array substrate, which is manufactured by the method as described above.

In a fourth aspect, the present disclosure further provides a display apparatus, which includes an array substrate according to any one of the embodiments as described above.

In the phase shift mask, the array substrate manufacturing method employing the phase shift mask, and the display apparatus including the array substrate that are disclosed herein, because of the presence of a compensating light-shielding portions over each side of a first light-shielding portion in the phase shift mask, the exposure at a region corresponding to the each side of the first light-shielding portion can be reduced by the compensating light-shielding portion, in turn causing the issue of overexposure at a region corresponding to the first light-shielding portion to be effectively prevented.

In addition, because each compensating light-shielding portion is further configured to have a width smaller than a resolution of an exposing machine employed for the patterning process, the photoresist used during exposure will not generate any remains at a region corresponding to the each compensating light-shielding portion, and therefore, a pattern will not be generated after exposure at a region corresponding to the each compensating light-shielding portion.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A phase shift mask, comprising:

a transparent substrate; and a plurality of light-shielding portions over the transparent substrate;

wherein:
the plurality of light-shielding portions comprise a first light-shielding portion and a first compensating light-shielding portion arranged over one side of the first light-shielding portion, wherein:
there is a first distance between the first compensating light-shielding portion and the first light-shielding portion;
the first compensating light-shielding portion has a first width smaller than a resolution of an exposing machine utilized for an exposure process using the phase shift mask; and
the first distance is configured to allow the first compensating light-shielding portion to reduce an exposure at a region corresponding to the one side of the first light-shielding portion during the exposure process;
wherein the plurality of light-shielding portions further comprise a second light-shielding portion and a third light-shielding portion, spaced apart from each other with a third distance; and
a difference between the first distance and the third distance is smaller than or equal to 0.3 μm.

2. The phase shift mask of claim 1, wherein the plurality of light-shielding portions further comprise a second compensating light-shielding portion having a second distance to another side of the first light-shielding portion facing thereto, wherein:
the second compensating light-shielding portion has a second width smaller than the resolution of the exposing machine; and
the second distance is configured to allow the second compensating light-shielding portion to reduce an exposure at a region corresponding to the another side of the first light-shielding portion during the exposure process.

3. The phase shift mask of claim 2, wherein:
the first light-shielding portion is a wiring-shielding portion; and
the first compensating light-shielding portion and the second compensating light-shielding portion are respectively arranged over two sides of the wiring-shielding portion along an extension direction of the wiring-shielding portion.

4. The phase shift mask of claim 3, wherein at least one of the first compensating light-shielding portion and the second compensating light-shielding portion is substantially parallel to the wiring-shielding portion.

5. The phase shift mask of claim 4, wherein each of the first compensating light-shielding portion and the second compensating light-shielding portion is substantially parallel to the wiring-shielding portion.

6. The phase shift mask of claim 1, wherein:
the resolution of the exposing machine is about 3.0 μm; and
the first width has a range of 1 μm-2 μm.

7. The phase shift mask of claim 1, wherein the first distance is substantially equal to the third distance.

8. The phase shift mask of claim 1, wherein the second light-shielding portion and the third light-shielding portion have a substantially same shape and size.

9. The phase shift mask of claim 1, wherein the second light-shielding portion, the third light-shielding portion, and the channel light-transmitting region are configured respectively for defining a source electrode, a drain electrode, and a channel region of a thin-film transistor.

10. A phase shift mask, comprising:
a transparent substrate; and
a plurality of light-shielding portions over the transparent substrate;
wherein:
the plurality of light-shielding portions comprise a first light-shielding portion and a first compensating light-shielding portion arranged over one side of the first light-shielding portion, wherein:
there is a first distance between the first compensating light-shielding portion and the first light-shielding portion;
the first compensating light-shielding portion has a first width smaller than a resolution of an exposing machine utilized for an exposure process using the phase shift mask; and
the first distance is configured to allow the first compensating light-shielding portion to reduce an exposure at a region corresponding to the one side of the first light-shielding portion during the exposure process;
wherein:
the plurality of light-shielding portions further comprise a second compensating light-shielding portion having a second distance to another side of the first light-shielding portion facing thereto;
the second compensating light-shielding portion has a second width smaller than the resolution of the exposing machine;
the second distance is configured to allow the second compensating light-shielding portion to reduce an exposure at a region corresponding to the another side of the first light-shielding portion during the exposure process;
the first light-shielding portion is a wiring-shielding portion; and
the first compensating light-shielding portion and the second compensating light-shielding portion are respectively arranged over two sides of the wiring-shielding portion along an extension direction of the wiring-shielding portion;
wherein:
the first width of the first compensating light-shielding portion is substantially equal to the second width of the second compensating light-shielding portion; and
the first distance is substantially equal to the second distance.

11. A phase shift mask, comprising:
a transparent substrate; and
a plurality of light-shielding portions over the transparent substrate;
wherein:
the plurality of light-shielding portions comprise a first light-shielding portion and a first compensating light-shielding portion arranged over one side of the first light-shielding portion, wherein:
there is a first distance between the first compensating light-shielding portion and the first light-shielding portion;
the first compensating light-shielding portion has a first width smaller than a resolution of an exposing machine utilized for an exposure process using the phase shift mask; and
the first distance is configured to allow the first compensating light-shielding portion to reduce an exposure at a region corresponding to the one side of the first light-shielding portion during the exposure process;

wherein each of the plurality of light-shielding portions comprises a light-shielding member and at least one phase shift member, wherein:
an orthographic projection of the light-shielding member on the transparent substrate defines a first region;
an orthographic projection of the at least one phase shift member on the transparent substrate defines a second region;
wherein:
each outer rim of the first region is surrounded by a phase shift region of a third width, wherein the phase shift region is within the second region but not within the first region.

12. The phase shift mask of claim 11, wherein the third width is smaller than 1.0 μm.

13. The phase shift mask of claim 12, wherein the third width is 0.6 μm.

14. A method for manufacturing an electronic component with the phase shift mask of claim 11, the method comprising:
forming a first layer;
forming a photoresist layer over the first layer; and
performing an exposure process with the phase shift mask aligned over the photoresist layer to thereby obtain a pattern in the photoresist layer.

15. The method of claim 14, wherein the plurality of light-shielding portions further comprise a second light-shielding portion and a third light-shielding portion, together defining a channel light-transmitting region having a third width sandwiched therebetween, wherein a difference between the first distance and the third distance is smaller than or equal to 0.3 μm.

16. The method of claim 15, wherein:
the first light-shielding portion is a wiring-shielding portion; and
the plurality of light-shielding portions further comprise a second compensating light-shielding portion having a second distance to another side of the wiring-shielding portion facing thereto over the transparent substrate, wherein:
the second compensating light-shielding portion has a second width smaller than the resolution of the exposing machine;
the second distance is within a second pre-set range configured to allow the second compensating light-shielding portion to reduce an exposure at a region corresponding to the another side of the wiring-shielding portion during the exposure process; and
the first compensating light-shielding portion and the second compensating light-shielding portion are respectively arranged over two sides of the wiring-shielding portion along an extension direction thereof.

17. The method of claim 16, wherein the first layer is a metal layer, wherein the method further comprising:
performing a patterning process on the metal layer using the pattern in the photoresist layer to thereby form a metallic pattern.

18. The method of claim 17, wherein the electronic component is an array substrate, wherein the metallic pattern comprises a source electrode, a drain electrode, and a metallic wiring.

* * * * *